United States Patent [19]
Poole

[11] Patent Number: 5,388,099
[45] Date of Patent: Feb. 7, 1995

[54] BACKPLANE WIRING FOR HUB IN PACKET DATA COMMUNICATIONS SYSTEM

[75] Inventor: Nigel T. Poole, Natick, Mass.

[73] Assignee: Digital Equipment Corporation, Maynard, Mass.

[21] Appl. No.: 964,791

[22] Filed: Oct. 22, 1992

[51] Int. Cl.$^6$ ............ H04B 3/02; H04L 5/20
[52] U.S. Cl. ............ 370/85.12; 370/85.1; 370/85.9; 370/85.15; 361/796; 361/803; 439/61; 327/365
[58] Field of Search ........... 370/60, 67, 29, 85.9, 370/85.12, 85.13, 85.14, 85.15; 370/110.1; 307/475, 241, 242, 243; 328/103, 104, 132; 340/825.79; 211/41; 361/796, 797, 799, 800, 803; 439/61; 333/12, 283; 174/32, 262

[56] References Cited

U.S. PATENT DOCUMENTS

| | | | |
|---|---|---|---|
| 3,992,686 | 11/1976 | Canning | 331/328 |
| 4,658,333 | 4/1987 | Grimes | 361/796 |
| 4,885,741 | 12/1989 | Douskalis | 370/84 |
| 5,103,378 | 4/1992 | Stowers et al. | 211/41 |
| 5,122,691 | 6/1992 | Balakrishnan | 370/110.1 |

*Primary Examiner*—Douglas W. Olms
*Assistant Examiner*—Huy D. Vu
*Attorney, Agent, or Firm*—David A. Dagg; A. Sidney Johnston; Albert P. Cefalo

[57] ABSTRACT

A backplane wiring scheme is provided for use in a hub of a packet data communications system. Line cards are connected to the backplane wiring arrangement in the hub, where each line card is a coupling to a network segment, a station or a to a bridge to other stations or segments. The connection is usually in either a ring or a bus topology, and increased flexibility, reduced power consumption, and easier implementation are provided by a unique wiring scheme. Each line card has a number of receive ports (e.g., N−1) and has two transmit ports, the transmit ports including a transmit-left port and a transmit-right port. The receive ports and transmit ports are arranged in a regular linear pattern on an edge of each of said line cards. The line cards are inserted in backplane slots, and backplane wiring paths are configured diagonally between ports of the cards to connect the transmit-left ports of the line cards to receive ports of line cards to the left and to connect the transmit-right ports of the line cards to receive ports of line cards to the right. When the transmit-left port and the transmit-right port of each of the line cards are connected together, the line cards are thereby configured as a bus. When only the transmit-left port and a top one of the receive ports are activated for all of the line cards, and the transmit-right port of only the left-most line card, are activated, the line cards are thereby configured as a ring.

13 Claims, 6 Drawing Sheets

BACKPLANE WIRING FOR HUB IN PACKET DATA COMMUNICATIONS SYSTEM

RELATED CASES

The application discloses subject matter also disclosed in the following copending U.S. patent applications, all of which are assigned to Digital Equipment Corporation:

Ser. No. 07/964,792, filed Oct. 22, 1992, by Nigel Terence Poole, for "CROSSBAR SWITCH FOR SYNTHESISING MULTIPLE BACKPLANE INTERCONNECT TOPOLOGIES IN COMMUNICATIONS SYSTEM" (PD92-0559);

Ser. No. 07/965,651, filed Oct. 22, 1992, by Bryan Alan Spinney, for "PACKET FORMAT IN HUB FOR PACKET DATA COMMUNICATIONS SYSTEM" (PD93-0012);

Ser. No. 07/964,738, filed Oct. 22, 1992, by Bryan Alan Spinney, for "ADDRESS LOOKUP IN PACKET DATA COMMUNICATIONS LINK, USING HASHING AND CONTENT-ADDRESSABLE MEMORY" (PD93-0016); and Ser. No. 07/965,121, filed Oct. 22, 1992, by Martin Edward Griesmer et al, for "APPARATUS AND METHOD FOR MAINTAINING FORWARDING INFORMATION IN A BRIDGE OR ROUTER" (PD93-0013).

BACKGROUND OF THE INVENTION

This invention relates to a backplane wiring scheme as used in hub in a packet data communications system, and more particularly to a backplane wiring scheme which allows line cards to be connected as either a bus or a ring configuration.

When a number of line cards are connected to a backplane wiring arrangement in a hub for a data communications system, where each line card is a network segment, a station or a bridge to other stations or segments, the connection is usually in either a ring or a bus topology.

A bus topology uses a collection of parallel wires running across the backplane. Each line card connects to the bus and uses one or more of the bus wires to communicate with the other line cards. The bus is often divided into channels, each channel containing some fixed number of bus wires. The bus wires in a given channel are all used in the same manner, whereas different channels can be used independently. A channel can be used as a broadcast bus, with some specified arbitration scheme, to provide a dynamic communication capability between two or more line cards; or it can be used in a fixed manner with the channel forming a dedicated communication link between two or more cards, the broadcast bus scheme is typically used to support connections amongst Ethernet repeaters in smart hubs; the fixed channel scheme is often used to support ring topologies as found in FDDI wiring concentrators. Bus topologies often require the use of bus-terminating resistors placed at each end of the bus to improve the electrical performance. Without these resistors, communication bandwidth is compromised.

The ring topology is used exclusively to support interconnection amongst line cards that are wired together in a closed one-way ring. The backplane connects the output of one line card to the input of the next line card. The disadvantage of this topology is (as with Christmas tree lights) if one line card dies or is removed, the whole ring dies. Palliative schemes to overcome this problem have been suggested, but none match the richness of interconnect offered by bus topologies.

When a collection of channels are wired in a ring topology, the line cards must be able to transmit onto and receive from any of the other channels (though the selection will be fixed once the ring topology is established). This expense can be avoided by providing a dedicated ring topology to the backplane, as will be described.

SUMMARY OF THE INVENTION

In accordance with one embodiment of the invention, a backplane wiring scheme is provided for use in a hub of a packet data communications system. Line cards are connected to the backplane wiring arrangement in the hub, where each line card is a coupling to a network segment, a station or a to a bridge to other stations or segments. The connection is usually in either a ring or a bus topology, and increased flexibility, reduced power consumption, and easier implementation are provided by a unique wiring scheme. Each line card has a number of receive ports (e.g., $N-1$) and has two transmit ports, the transmit ports including a transmit-left port and a transmit-right port. The receive ports and transmit ports are arranged in a regular linear pattern on an edge of each of said line cards. The line cards are inserted in backplane slots, and backplane wiring paths are configured diagonally between ports of the cards to connect the transmit-left ports of the line cards to receive ports of line cards to the left and to connect the transmit-right ports of the line cards to receive ports of line cards to the right. When the transmit-left port and the transmit-right port of each of the line cards are connected together, the line cards are thereby configured as a bus. When only the transmit-left port and a top one of the receive ports are activated for all of the line cards, and the transmit-right port of only the left-most line card, are activated, the line cards are thereby configured as a ring.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

DETAILED DESCRIPTION OF SPECIFIC EMBODIMENT

Figure 1:
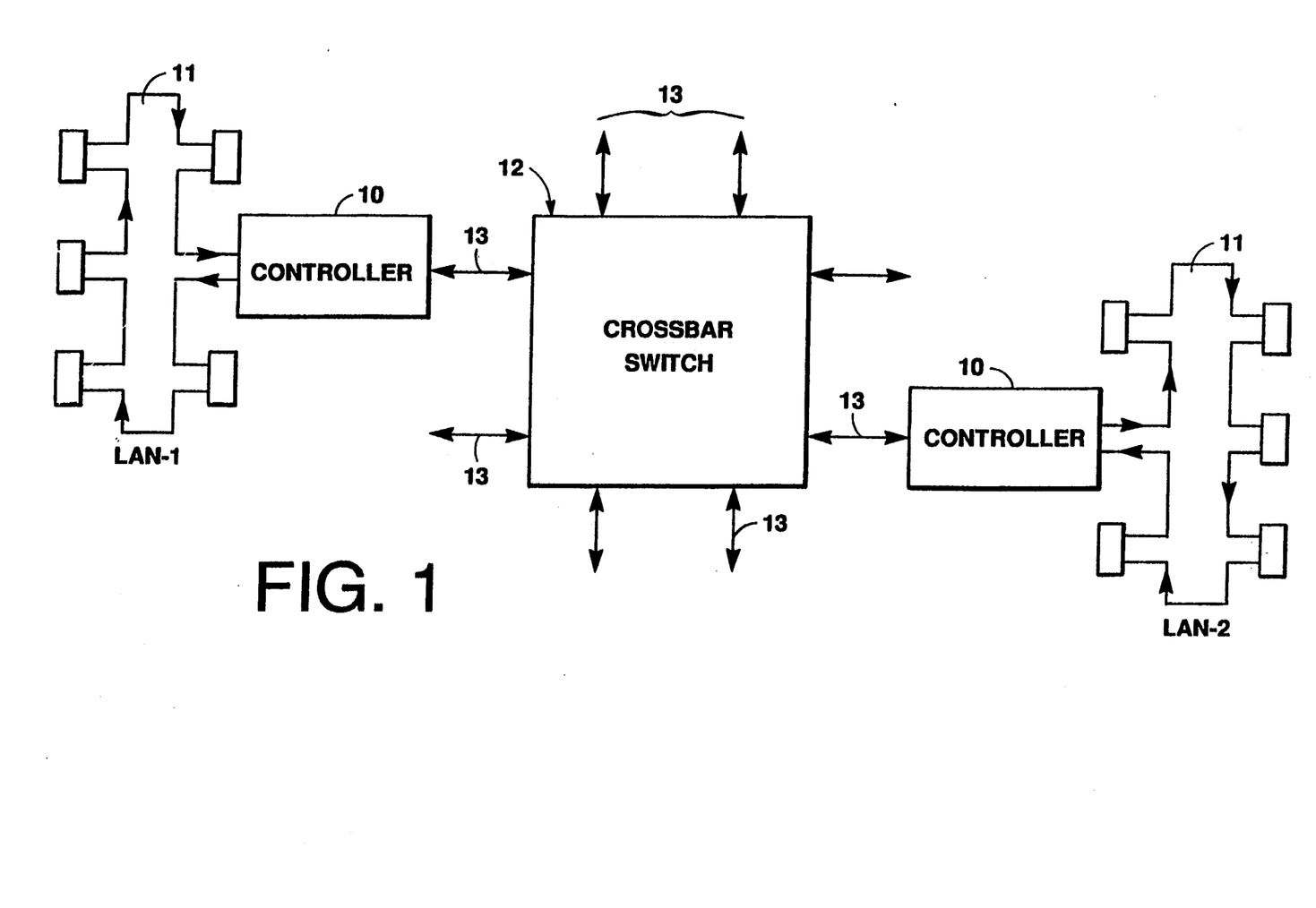
FIG. 1 is a diagram in block form of a communications network which may use features according to one embodiment of the invention.

Referring to FIG. 1, a packet data communications network which may use the features of the invention includes a controller 10 for interface between an FDDI link 11 and a crossbar switch device 12. The crossbar switch device 12 has a number of input/output ports 13, and each one of these ports 13 may be connected by another controller 10 to another network segment 11 such as an FDDI link or a token ring or Ethernet bus, for example. The crossbar switch 10 ordinarily makes a direct point-to-point interconnect between one port 13 and another port 13, so that the crossbar acts as a bridge or router in the network, linking one network segment to another. A station on a link 11 sends a packet onto its network segment with a destination address which is on another, different segment. The controller 10 for this segment detects the address as being that of a station on one of the remote segments, and generates local switching information to send to the crossbar 12 so that the appropriate interconnect can be made to send the packet to the proper port 13 and link 11, via another controller 10. As set forth below, the crossbar switch device can function as a flexible interconnect device to create a ring or bus using the ports 13, as well as functioning as a point-to-point connector as is the usual case for crossbar switches.

Figure 1A:
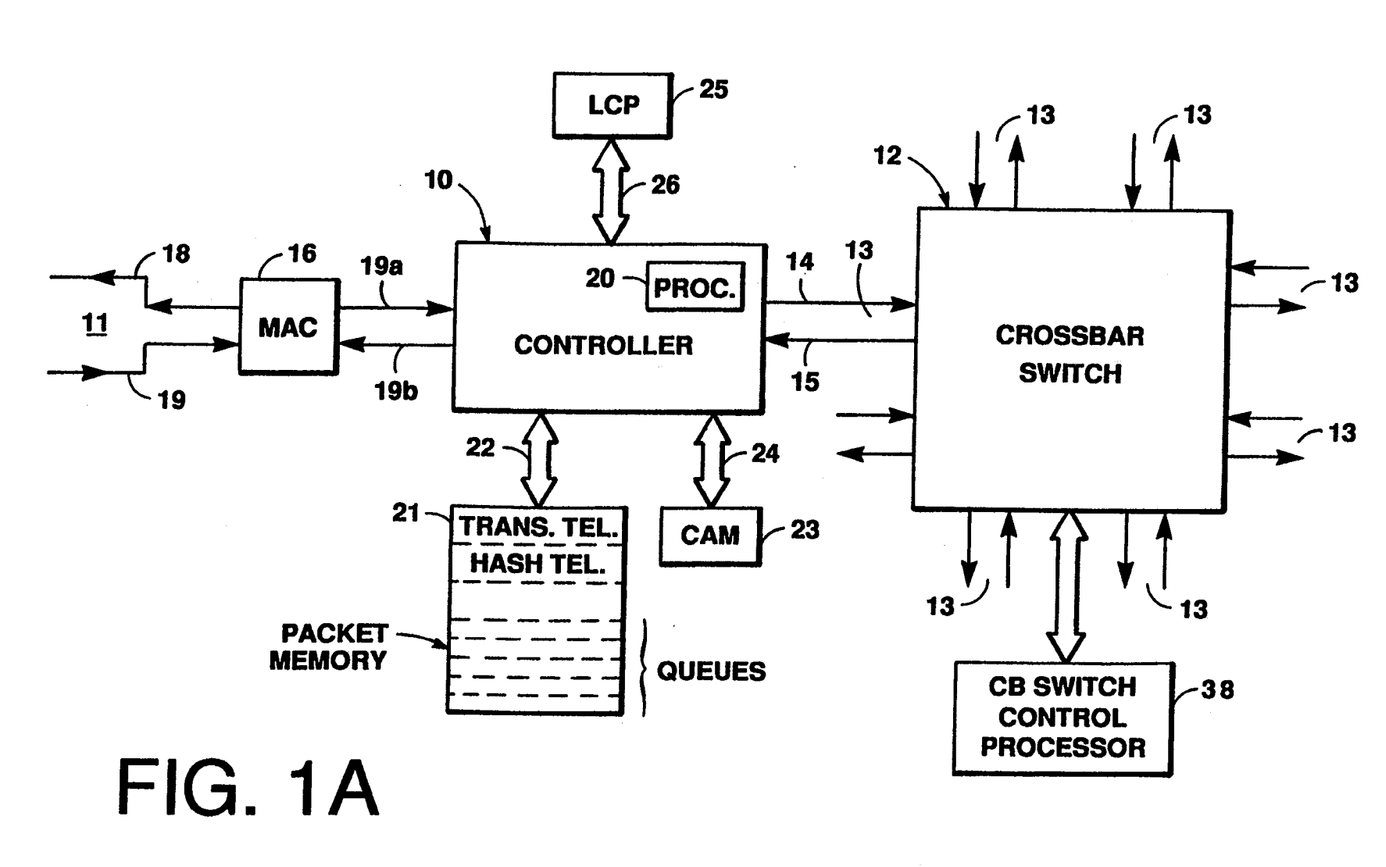
FIG. 1a is an electrical diagram in block form of a controller for the communications network of FIG. 1.

Referring to a more detailed view of FIG. 1a, each port 13 of the crossbar has a data-in path 14 and a separate data-out path 15. The interface between the controller 10 and the FDDI link 11 is by way of a media access control (MAC) device 16, functioning to convert the serial light transmission on the incoming fiber optic cable 17 to electrical pulses, to recover the clock, convert the serial data on the optic loop to 6-bit parallel symbols, act as an elastic buffer to allow reclocking of data entering the controller 10, etc. Of course, all of these functions are reversed for outgoing data on the cable 18. The interface between the controller 10 and the MAC device 16 is by an incoming 8-bit parallel data path 19a (with additional parity and control lines) and an outgoing 8-bit parallel path 19b.

The controller 10 contains a processor or state machine 20 to execute various processes as will be described, and accesses a packet memory 21 via an interface 22, as well as a content addressable memory (CAM) 23 via interface 24. The packet memory 21 is addressed by a 20-bit address bus, and data is transferred by a 56-bit bidirectional data bus, included in the interface 22; various control lines are also in the interface 22. The CAM 23 is driven by a 14-bit bus and various control lines in the interface 24. The packet memory 21 is a RAM which stores a number of queues for incoming and outgoing data packets, as well as translation tables and hash tables as will be described. In addition, the packet memory stores certain data for which addresses are matched in the CAM 23.

The controller 10 also interfaces with a line card processor 25 by bus 26. The line card processor 25 is used to execute some diagnostic and initialization functions, and does not operate in routine packet transfer. The controller 10 contains a processor or state machine 20 to execute various processes for packet data transfer as will be described. This processor 20 is a microprocessor or the like, executing a stored program, as is well known.

Figure 2:
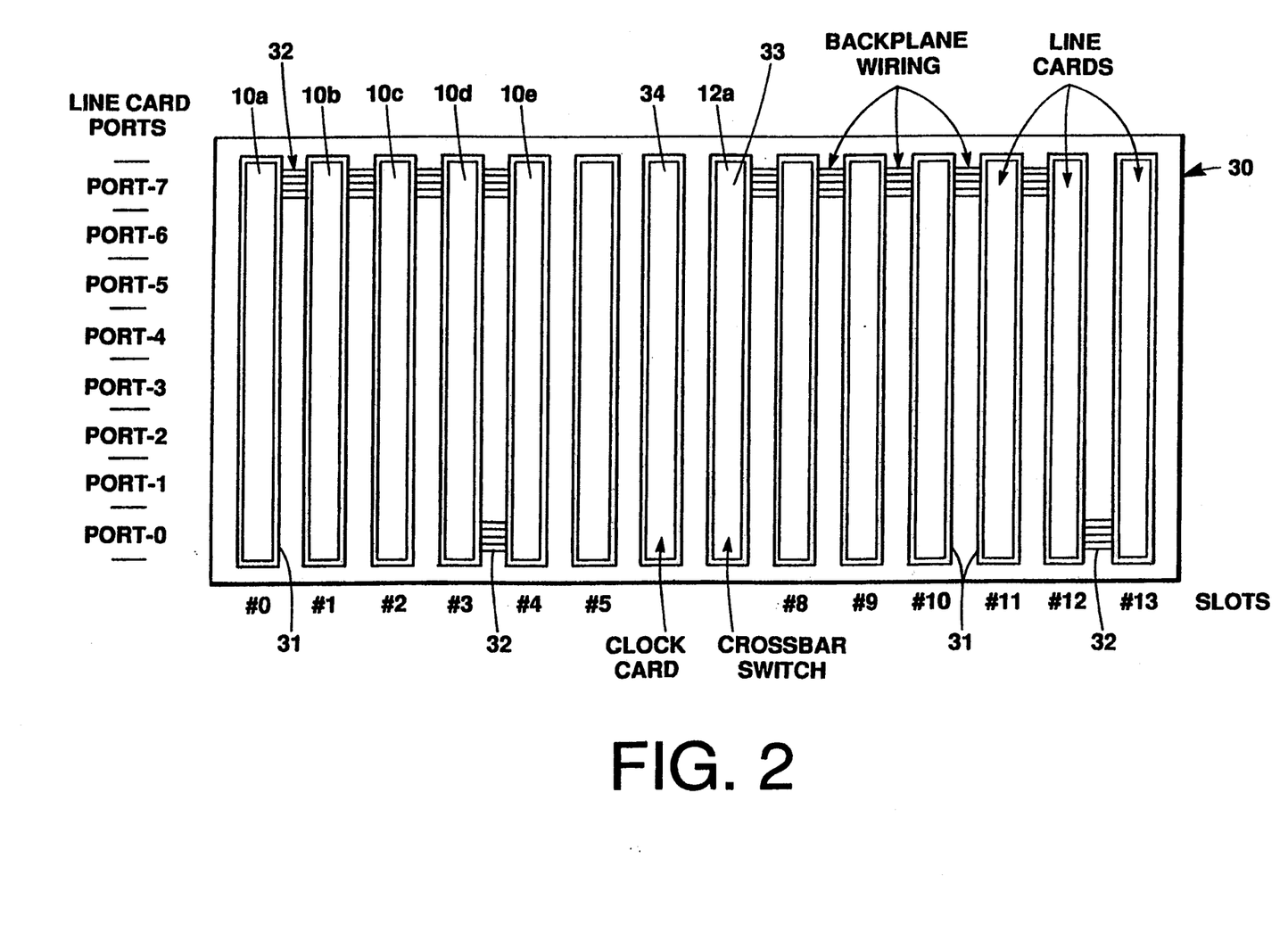
FIG. 2 is a diagram of construction of a hub used in the system of FIG. 1, with slots for line cards and a backplane wiring scheme.
Figures 3, 9, 10:
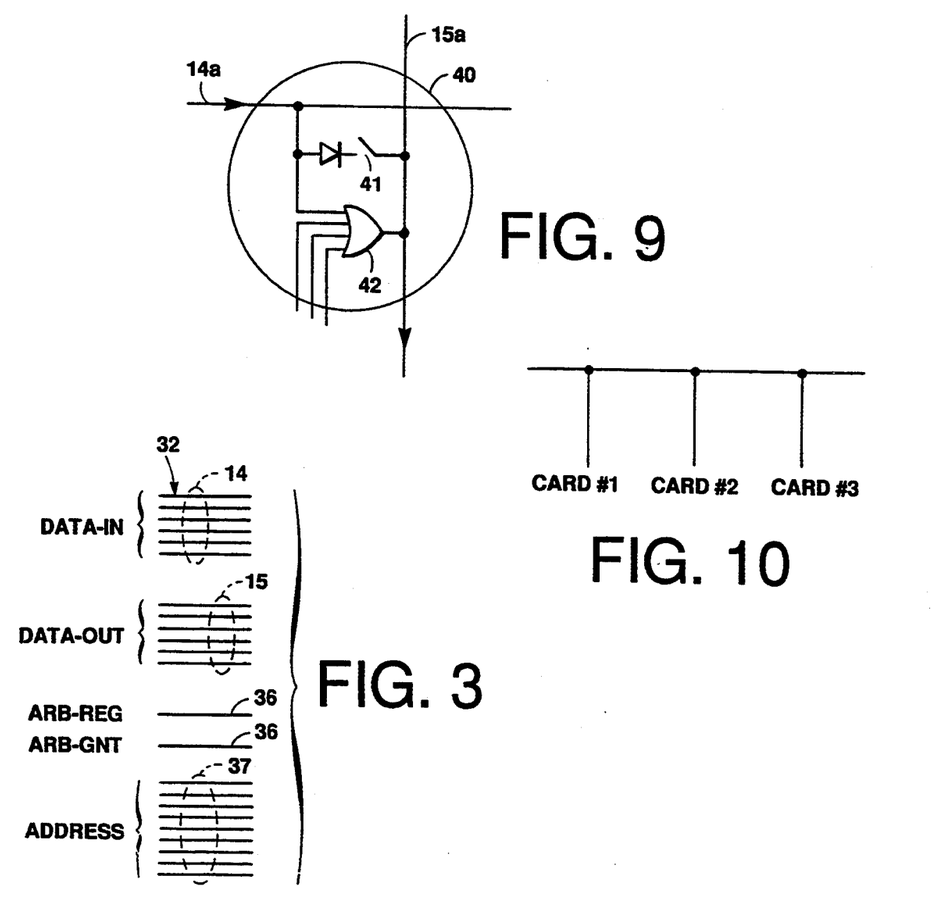
FIG. 3 is a diagram of a form of a backplane wiring parallel bus used in the hub of FIG. 2.
FIG. 9 is a diagram of a detail of the crosspoints in the embodiment of FIG. 8.
FIG. 10 is a diagram of implementation of a bus topology in the embodiment of FIGS. 8 and 9.

Referring to FIG. 2, a hub in a communications network including the system of FIG. 1 is constructed, in one embodiment, using a housing or cabinet 30 having a number of line cards 10a, 10b, 10c, etc., (up to twelve line cards in one embodiment, each line card having a controller 10 therein) which are plugged into slots 31 for a backplane wiring arrangement 32 as will be described. The crossbar switch 12 is also constructed on a card 12a plugged into a slot 33 to connect to the backplane wiring. A clock card 34 is plugged into a slot in the backplane wiring to supply clocks to provide synchronous timing for all of the components of the backplane on the bus. Each one of the line cards 10a, 10b, etc., can contain one of the controllers 10 to engage a port 13 of the crossbar, or, alternatively, more than one of the controllers 10 can be located on one line card so that a line card supports more than one of the ports 13. In either event, a controller 10 of a line card has a network segment such as an FDDI link 11 or another crossbar connected to it; if there are more than one port supported, then there is a link 11 for each port. The backplane wiring 32 is constructed as a synchronous parallel bus which is arbitrated, with the various line cards 10a, 10b, etc., and the crossbar 12, requesting and being granted access to the bus for each cycle. In a given hub, not all of the twelve line cards and seven port positions per line card are populated at one time; the crossbar switch 12 can handle only thirty-six ports, total, in one embodiment. Thus, usually not all of the slots have line cards in them, and on a line card there is only one (or two) ports. The particular one of the seven potential port positions on a card that is used depends upon the function to be implemented, as will be described. However, the synchronous parallel bus must contain both input path 14 and output path 15 for each port 13, so the synchronous parallel bus interconnecting all of the slots with the crossbar switch 12 contains a number of complete sets of data-in and data-out lines 14 and 15, with each set including six lines for data-in and six lines for data-out, as seen in FIG. 3. In addition, the backplane wiring 32 includes arbitration lines 36 going from each line card processor 25 to the crossbar; the arbitration lines include a request line and a grant line separately for each one of the line cards. Address lines 37 are used to designate the port to which data is to be sent, along with a code indicating the type of bus cycle. The backplane bus acts in a pipelined manner. Data is exchanged in each bus clock cycle, while arbitration and addressing for subsequent cycles are going on. That is, an entire data exchange requires several cycles, but these are pipelined so a complete data exchange occurs on average in every bus cycle. The cycles for a data exchange include a request cycle, a grant cycle and address cycle occurring simultaneously, a data send/receive cycle with a response (acknowledge), and an error reporting cycle. If a controller 10 is sending a packet to another controller 10 on the crossbar, it is handled on a cycle-by-cycle basis; the controller requests the bus when a symbol is ready to send, then when the bus is granted sends to the crossbar the address of the destination followed by the data of this symbol. A common path (the backplane bus) is thus shared for all connections between ports 13 of the crossbar, on a time-division multiplexed basis. A crossbar switch control processor 38 in the crossbar card 33 receives all of the lines of the backplane wiring 32 and controls arbitration for the bus as described.

Figure 4:
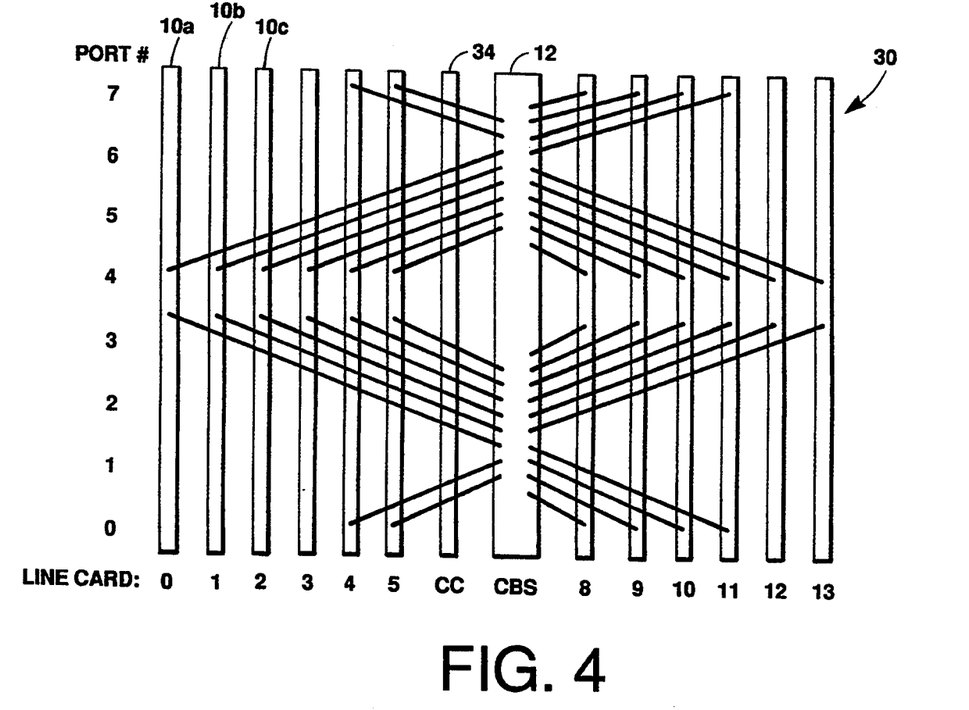
FIG. 4 is a diagram of a way of wiring the backplane of FIG. 2, according to one example of construction.

At least one of the seven potential ports on a line card is usually connected by the backplane wiring directly to the crossbar switch 12 for point-to-point communication with any of the ports 13 of the crossbar. For example, as seen in FIG. 4, port #3 and port #4 of each of twelve line cards is connected to the crossbar switch 12 by the backplane bus, and port #0 and port #7 are likewise directly connected to the crossbar for line cards #4, #5, #8, #9, and #10. Thus, for these cards, any of the directly-connected ports #'s can have their crossbar connections controlled by the controller 38. However, other port #'s of the line cards for the hub have differently-wired connections to provide "smart" hub functions.

Figure 5:
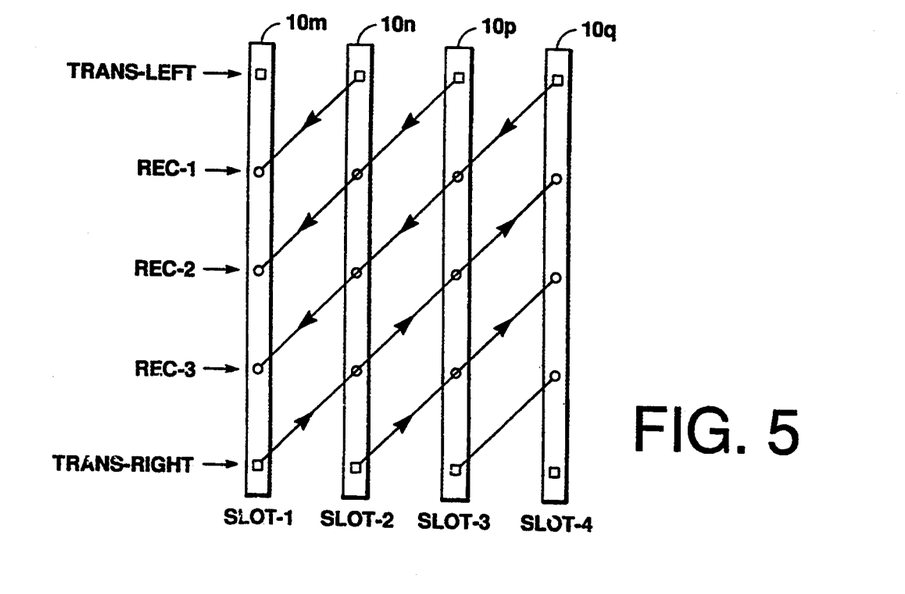
FIG. 5 is a diagram of a backplane wiring scheme according to one embodiment of the invention.

Referring to FIG. 5, an important feature of one embodiment is the provision of separate connecting paths between certain ones of the line cards, these paths not using the backplane wiring 32 of FIG. 3 or going through the crossbar switch 12. In a simplified scheme, illustrated in FIG. 5 for explanatory purposes, a four-slot backplane includes slots 31 for line cards 10m, 10n, 10p and 10q, referred to as backplane slot-1, slot-2, slot-3, and slot-4. Each line card 10p, etc., has five logical connections to the backplane, two indicated by a "□" being transmit ports and three indicated by a "○" being receive ports. Data flows from the line card into the backplane at the transmit ports, and data flows from backplane onto the line card at the receive ports. In general, there are always two transmit ports but there will be (N−1) receive ports for a backplane with N slots. In contrast to a typical bus topology, the wiring pattern shown is diagonal, rather than horizontal, with connections 10s allowing data to flow from a transmit port to a receive port. The connections (ports) are either transmit or receive, whereas in a typical bus topology of a backplane, each port is required to support both transmit and receive capability, as is used for the backplane wiring of FIGS. 2 and 3 connecting all of the slots to the crossbar and clock card.

Figure 6:
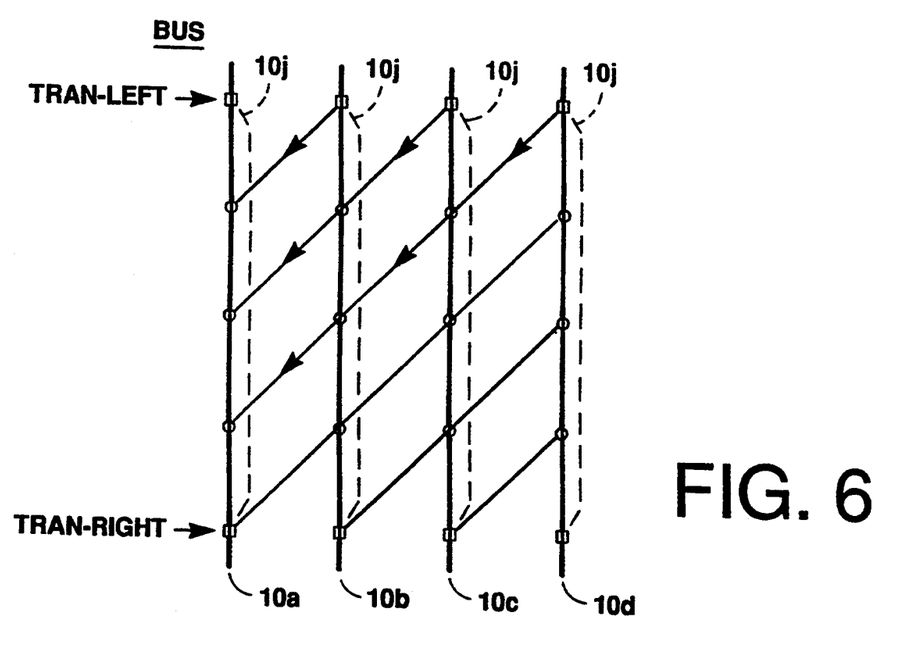
FIG. 6 is a diagram of a wiring arrangement using the scheme of FIG. 5 to create a bus topology.
Figure 7:
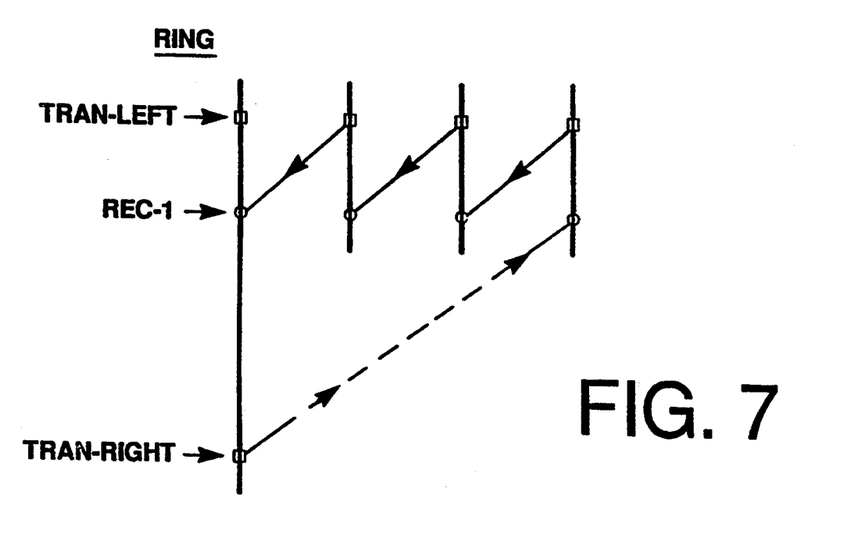
FIG. 7 is a diagram of a wiring arrangement using the scheme of FIG. 5 to create a ring topology.

The wiring scheme of FIG. 5 includes the "bus" and "ring" topologies as subsets. If each daughter card 10m, 10n, 10p, and 10q connects the two transmit ports (transmit-left and transmit-right) together internally (indicated by a jumper 10j) as seen in FIG. 6, a bus is provided in which any port (card) can transmit to the bus and all other ports will simultaneously receive. The backplane wiring to implement this construction looks like a typical bus, except that the bus is "helical" rather than horizontal. On the other hand, if only the top two ports (transmit-left and receive-1) are considered, as illustrated in FIG. 7, a ring topology is provided. The ring is completed by including the transmit-right port of slot-1. The three cards in slot-1 to slot-3 of FIG. 7 each receive at their receive-1 port data frown the transmit-left port of the card to their right, will the card in slot-4 receives from the transmit-right port of the card in slot-1, completing a closed ring. No card can transmit to any other card except by the connection of FIG. 7. In the embodiment of FIG. 4, the port-0, port-1, port-2, port-3, port-5, port-6, and port-7 of line cards in slot-0 to slot-3, for example, can be connected as in FIGS. 5-7, simulating a bus or a ring in a permanent configuration, not using the crossbar switch 12.

Figure 8:
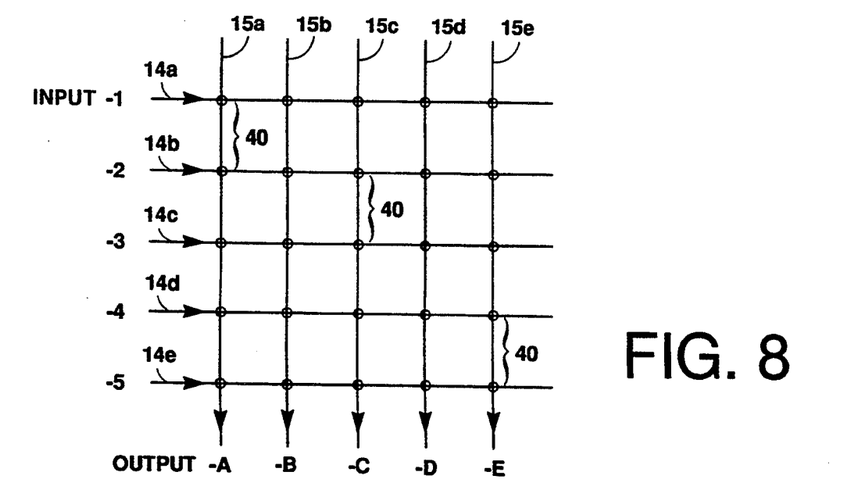
FIG. 8 is a diagram of a crossbar arrangement according to a separate embodiment of construction of the system of FIG. 1.

The scheme of FIGS. 8-10 can support multiple rings, where each ring includes an arbitrary collection of line cards (where each line card belongs to only one ring). This flexibility is often required in token ring hubs and FDDI wiring concentrators, and is typically supported by having N backplane bus channels where there are N slots. Clearly, both the N horizontal channels and the (N+1)-port proposed scheme can support such arbitrary ring connectivity requirements.

For supporting such arbitrary ring topologies, the scheme of FIGS. 5-7 offers several advantages over an N-channel backplane bus.

First, from a line card's perspective, the two transmit ports are always in the same place. Thus, at most two transmitters are required to communicate with other line cards. In a typical bus topology, with N backplane slots, a line card requires N transmitters in order to transmit onto any one of the N bus channels.

Second, each line card requires only (N−1) receivers, in contrast to the requirement for N receivers for a typical backplane having N channels.

Third, each line card's transmitter is always transmitting at one end of the diagonal bus; in a typical horizontal bus scheme, the transmitters must be capable of driving a bus at any point along its physical length. Several electrical advantages are available when a bus needs only to be driven at one end. One, the transmitter sees a lower load impedance; its drive requirements are lower, which may translate into cheaper, smaller faster or lower power transmitters. Two, reflections on the bus can be controlled by terminating the bus at one end only, namely at the transmitter. This is not possible in a horizontal scheme, since the transmitter is not guaranteed to be at the end of the bus. Accordingly, termination resistors are usually required on a horizontal bus. These termination resistors must be physically mounted on the backplane (or arranged to be permanently at the bus ends by other means). The termination resistors often consume power, complicate backplane implementation, and reduce reliability. The series termination scheme available with the diagonal bus wiring of FIG. 5 eliminates the need for terminating resistors on the backplane and reduces power requirements.

Fourth, increased flexibility is offered for relay cards. A relay card (such as a bridge or router card) will often be required to connect to two (or more) rings, where each ring connects together a collection of mutually exclusive daughter cards. The increased flexibility is offered by connecting one ring to one transmit port, and the other ring to the other transmit port of the relay card. This places the restriction that the relay card must have at lest one line card on the left and one on the right (i.e., the relay card cannot be in the leftmost or rightmost slot of the backplane).

In the construction of a hub as described in reference to FIG. 2, the slot into which a line card is placed determines its possible functions in a system. Also, the port number (port-0 to port-7) that is used to connect a given line card in a given slot to the backplane wiring (or to wiring of FIGS. 5-7) also determines the possible functions in the system. Of course, as an alternative, the port number used can be changed by programming the line card controller 10, dynamically or statically, as well as by mechanically changing the wiring connections.

In another alternative embodiment, the connections to form a ring or bus topology may be implemented in the crossbar switch itself, instead of in the backplane wiring configuration. This alternative will now be described in reference to FIG. 8-10.

The crossbar switch 12 has the general function of making a connection between one of its ports 13 and another port 13, upon request. Referring to FIG. 8, the crossbar switch 12 is shown in simplified form, for illustrative purposes. In this example, only five inputs 14a-14e (horizontal lines or "rows") and five outputs 15a-15e (vertical lines or "columns") are shown, though it is understood that in an embodiment of the invention there are thirty-six ports 13, and of course larger crossbar switches can be constructed. The five inputs lines 14a, etc., are labelled input-1, input-2, etc., and the five output lines 15a, etc., are labelled output-A, output-B, etc., for reference in the explanation of operation. In FIG. 8, the crosspoints 40 between horizontal lines 14a, etc., and vertical lines 15a, etc., are each programmed to be either "on" or "off." In the "on" state, data from a horizontal input line is copied onto the vertical output line, essentially by closing a switch at the crosspoint 40. In an embodiment as described wherein all of the ports share a synchronous parallel bus, each crosspoint 40 represents an arbitrated connection to the bus, under control of arbitration logic or the processor 38. Also, the connections at crosspoints 40 in FIG. 8 are unidirectional, so for the data path of a port 13 with both input and output paths 14, 15 an input line and an output line are connected.

Some observations are valid for crossbar switches of the type shown in FIG. 8. First, it is possible for all crosspoints 40 in a row to be "off"; in this case, the data input 14a, etc., on that row is ignored. Second, it is possible for one or more crosspoints 40 in a row to be "on"; in this case, data is copied from the input row onto all outputs 15a, etc., whose corresponding crosspoint 40 is "on." Third, it is possible for all crosspoints in a column 15a, etc., to be "off"; in this case, there is no output to that column. Fourth, it is ordinarily not possible to have more than one crosspoint 40 "on" in a column; this would cause conflict with multiple inputs attempting to drive the same output. According to a feature of this embodiment, however, as described below, provision is made for allowing this condition for certain connections.

Typically, a line card mating with a backplane as illustrated in FIG. 2 will submit an input/output pair 14, 15 to the crossbar switch 12, e.g., card #1 will connect to input-1 and output-A, card #2 will connect to input-2 and output-B, etc. The crossbar switch 12 of FIG. 2 can thus be programmed dynamically to support packet switched point-to-point connections, using the processor 37. However, in some situations static connections need to be established for supporting ring topologies, for example.

Assume that cards #1, #2, and #3 of FIG. 8 are to be connected in a ring, with data flow

1 → #2 → #3 → #1

Then by programming crosspoints 1B, 2C and 3A to be "on" and the other six crosspoints 40 associated with these three cards (1A, 1C, 2A, 2B, 3B, 3C) to be "off," the required ring topology is realized. Here, a crosspoint 1B means the crosspoint 40 at the intersection of input-1 and output 1B. Thus, any desired ring topology can be synthesized by programming the crossbar 12 appropriately, particularly by programming the controller 37 to allow only these connections and to reject a request for a direct point-to-point connection between arbitrary ports 13.

While a classic crossbar switch as described can be configured as a ring as described, it is sometimes necessary to support broadcast bus topologies, as used, for example, in Ethernet repeaters. This can be done by adding another capability at each crosspoint 40, according to this embodiment of the invention.

The crosspoint switches 40 (functionally speaking) include, in addition to the unidirectional switch 41 of FIG. 9 controlled by processor 37, other logic elements; in the simplest case the logic elements are OR gates 42. Of course, this is simulated in the controller 37 for the crossbar 12 using the synchronous parallel bus rather than in direct-wired circuitry. The OR gate 42 allows multiple inputs 14a, etc., to connect simultaneously to an output 15a, etc. This removes the fourth restriction mentioned above. Now each crosspoint 40 in the switch 12 can be either "on" or "off" completely independently of all the other crosspoints. If the crossbar switch is supporting analog, rather than digital, signals, then the OR gate can be replaced by an analog equivalent, e.g., a greatest magnitude selector or voltage summation operator.

With the enhancement of the crossbar switch as seen in FIG. 9, if multiple inputs are connected to the same output, then the output will be the logical OR of all the inputs. This crossbar switch can now be programmed to synthesize a bus interconnect. Consider, for example, that the three cards #1, #2, and #3, mentioned above, are to be connected to a common bus 45 as shown in FIG. 10. To accomplish this, all of the crosspoints 1A, 1B, 1C, 2A, 2B, 2C, 3A, 3B, 3C, are permanently programmed to the ON state. IN this case, any data sent to the crossbar switch 12 from card #1 by line 14a will be received by all three cards, as will data sent from card #2 or card #3. If two or more cards send data to the crossbar simultaneously, all three cards will receive the same thing, probably garbled data, the logical OR of all data being sent. This is analogous to the behavior of a wired-OR bus. The Ethernet type of collision sense is used to account for attempted simultaneous transmission on a bus, as is common practice.

Logically, the controller 10 consists of six independent processes. There are two for inbound packet processing, two for outbound packet processing, one for interfacing to the external packet memory 21, and one for line card processor 25 access. Packets inbound on FDDI line 17 and going through the controller 10 to the crossbar switch 12 are referred to as "inbound." Likewise, packets going in the direction of crossbar switch 12 through the controller 10 to the FDDI output line 18 are referred to as "outbound." By having independent processes which can operate in parallel, the controller 10 can process inbound and outbound packets at full speed. Distributed among the processes are control, parameter and status registers that are used to define the operational modes and to determine the internal state of the controller 10; these registers are accessed through the line card processor interface 26. These processes are described in above-mentioned copending applications Ser. Nos. 07/964,792, 07/965,651, 07/964,738, 07/965,121, filed herewith and assigned to Digital Equipment Corporation, assignee of this invention.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. A hub for use in a data communications system, comprising:
   N line cards, where N is an integer, each line card having N−1 receiving ports and having two transmitting ports, the transmitting ports including a transmit-left port and a transmit-right port;
   N backplane slots, each slot adapted to receive one of said line cards;
   a plurality of backplane wiring paths between the connectors of said slots to connect said transmit-left ports of said line cards to receiving ports of line cards to the left and to connect said transmit-right ports of said line cards to receiving ports of line cards to the right;
   means for configuring the line cards into selectively one of a bus configuration OR a ring configuration; and
   wherein said receiving ports and said transmitting ports are arranged in a regular linear pattern on an edge of each of said line cards, and connectors in said slots for said transmitting and receiving ports of said line cards are physically arranged in a regular matrix pattern, and said backplane wiring paths are configured diagonally, and said transmit-left ports are all at one end of said linear pattern and said transmit-right ports are all at the other end of said linear pattern.

2. A hub for use in a data communications system, comprising:
   a plurality of line cards, each line card having a plurality of receiving ports and having two transmitting ports, the transmitting ports including a transmit-left port and a transmit-right port;
   a plurality of backplane slots, each slot adapted to receive one of said line cards;
   a plurality of backplane wiring paths between the connectors of said slots to connect said transmit-left ports of said line cards to receiving ports of line cards to the left and to connect said transmit-right ports of said line cards to receiving ports of line cards to the right; and
   wherein said transmit-left port and said transmit-right port of each said line card are connected together, and said line cards are thereby configured as a bus.

3. A device according to claim 2 wherein there are N said line cards and N said slots, where N is an integer, and wherein there are (N−1) said receiving ports in each line card.

4. A hub for use in a data communications system comprising:
   a plurality of line cards, each line card having s plurality of receiving ports and having two transmitting ports, the transmitting ports including a transmit-left port and a transmit-right port;
   a plurality of backplane slots, each slot adapted to receive one of said line cards;
   a plurality of backplane wiring paths between the connectors of said slots to connect said transmit-left ports of said line cards to receiving ports of line cards to the left and to connect said transmit-right ports of said line cards to receiving ports of line cards to the right; and
   wherein only said transmit-left port and a first one of said receiving ports are activated for all of said line cards, and said transmit-right port of only the left-most of said line cards is activated, and said line cards are thereby configured as a ring.

5. A device according to claim 4 wherein there are N said line cards and N said slots, where N is an integer, and wherein there are (N−1) said receiving ports in each line card.

6. A method of operating a hub in a data communications system, comprising the steps of:
   connecting a plurality of line cards to said hub, each line card having a plurality of receiving ports and having two transmitting ports, the transmitting ports including a transmit-left port and a transmit-right port, said receiving ports and transmitting ports being arranged in a regular linear pattern on an edge of each of said line cards;
   selectively positioning said line cards in a plurality of backplane slots, each slot adapted to receive one of said line cards whereby connectors for said transmitting and receiving ports of said line cards are physically arranged in a regular matrix pattern;
   and configuring the lines cards into selectively one of a bus configuration OR a ring configuration by selectively interconnecting said ports of said line cards by a plurality of backplane wiring paths configured diagonally between said connectors of said slots to connect said transmit-left ports of said line cards to receiving ports of line cards to the left and to connect said transmit-right ports of said line cards to receiving ports of line cards to the right.

7. A method according to claim 6 further comprising the steps of:
   limiting the number of said line cards and slots to N said line cards and N said slots, where N is an integer;
   and limiting the number of said receiving ports to (N−1) said receiving ports in each line card.

8. A method according to claim 7 including positioning all said transmit-left ports at one end of said linear pattern and all said transmit-right ports at the other end of said linear pattern.

9. A method according to claim 6 including connecting said transmit-left port and said transmit-right port of each said line card together, and said line cards are thereby configured as a bus.

10. A method according to claim 9 wherein there are N said line cards and N said slots, where N is an integer, and wherein there are (N−1) said receiving ports in each line card.

11. A method according to claim 6 wherein only said transmit-left port and a first one of said receiving ports are activated for all of said line cards, and said transmit-right port of only the left-most of said line cards is activated, and said line cards are thereby configured as a ring.

12. A method according to claim 11 wherein there are N said line cards and N said slots, where N is an integer, and wherein there are (N−1) said receiving ports in each line card.

13. A method according to claim 6 including connecting a crossbar switch to other ports of said line cards by a separate horizontal backplane bus.

* * * * *